United States Patent
Bae et al.

(10) Patent No.: US 10,847,584 B2
(45) Date of Patent: Nov. 24, 2020

(54) DISPLAY DEVICE AND MANUFACTURING METHOD THEREOF

(71) Applicant: Samsung Display Co., Ltd., Yongin-Si (KR)

(72) Inventors: Kwangsoo Bae, Yongin-si (KR); Jungsuk Bang, Hwaseong-si (KR); Minjeong Oh, Gimpo-si (KR); Boram Lee, Seongnam-si (KR); Youngje Cho, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/379,594

(22) Filed: Apr. 9, 2019

(65) Prior Publication Data

US 2020/0020746 A1  Jan. 16, 2020

(30) Foreign Application Priority Data

Jul. 16, 2018  (KR) .......................... 10-2018-0082034

(51) Int. Cl.
*H01L 27/32* (2006.01)
*H01L 51/56* (2006.01)
*H01L 51/52* (2006.01)

(52) U.S. Cl.
CPC ........ *H01L 27/322* (2013.01); *H01L 27/3258* (2013.01); *H01L 51/5253* (2013.01); *H01L 51/5262* (2013.01); *H01L 51/56* (2013.01); *H01L 51/5275* (2013.01); *H01L 51/5284* (2013.01)

(58) Field of Classification Search
CPC .............. H01L 27/322; H01L 51/5253; H01L 27/3258; H01L 51/5275; H01L 51/56; H01L 51/5262; H01L 51/5284; H01L 2251/5369

USPC .......................................... 257/40, 72, 88, 89
See application file for complete search history.

(56) References Cited

U.S. PATENT DOCUMENTS

| | | | |
|---|---|---|---|
| 8,921,840 B2 | 12/2014 | Kim et al. | |
| 9,810,813 B2 | 11/2017 | Kim et al. | |
| 9,817,264 B2 | 11/2017 | Li | |
| 9,853,093 B2 | 12/2017 | Shim et al. | |
| 10,048,412 B2 | 8/2018 | Li | |
| 2015/0084026 A1* | 3/2015 | Miyamoto et al. ......... | H01L 51/5275 257/40 |
| 2016/0087245 A1 | 3/2016 | Park et al. | |

FOREIGN PATENT DOCUMENTS

| | | |
|---|---|---|
| JP | 2015-222645 A | 12/2015 |
| KR | 10-2014-0059372 A | 5/2014 |
| KR | 10-2016-0034457 A | 3/2016 |
| KR | 10-2016-0034458 A | 3/2016 |
| KR | 10-2016-0111580 A | 9/2016 |

* cited by examiner

*Primary Examiner* — Thinh T Nguyen

(74) *Attorney, Agent, or Firm* — Innovation Counsel LLP

(57) ABSTRACT

A display device includes a substrate on which a pixel area and a non-pixel area around the pixel area are defined, an encapsulation layer disposed on the substrate, a light conversion layer including a light converter disposed on the encapsulation layer to overlap the pixel area, and a light guide layer disposed between the encapsulation layer and the light conversion layer to define a first cavity that overlaps the pixel area and a second cavity that overlaps the non-pixel area.

15 Claims, 12 Drawing Sheets

DISPLAY DEVICE AND MANUFACTURING METHOD THEREOF

CROSS-REFERENCE TO RELATED APPLICATIONS

This U.S. non-provisional patent application claims priority to and benefit of Korean Patent Application No. 10-2018-0082034, filed on Jul. 16, 2018, the entire contents of which are hereby incorporated by reference.

BACKGROUND

One or more aspects of embodiments of the present disclosure are directed toward a display device and a manufacturing method thereof.

In general, a display device includes a plurality of pixels for displaying an image. Each of the pixels includes an image display element disposed on a pixel area and a driving element disposed around the pixel area. As the driving element drives the image display element and the image display element generates predetermined light, an image may be displayed.

In recent years, a display device including light converters has been developed to improve color purity. The light converters are disposed on the pixels to convert light generate from the pixels into light having different wavelengths. Each of the light converters overlaps a corresponding pixel. Each of the light converters includes quantum dots that convert a wavelength of light.

Light generated from each of the pixels is provided to a corresponding light converter. However, when the light generated from each of the pixels is not provided to the corresponding light converter but provided to another light converter adjacent thereto, a color mixture phenomenon may occur.

SUMMARY

The present disclosure provides a display device capable of preventing a color mixture phenomenon and improving a light efficiency and a manufacturing method thereof.

An embodiment of the inventive concept provides a display device including: a substrate on which a pixel area and a non-pixel area around the pixel area are defined; an encapsulation layer disposed on the substrate; a light conversion layer including a light converter disposed on the encapsulation layer to overlap the pixel area; and a light guide layer disposed between the encapsulation layer and the light conversion layer to define a first cavity that overlaps the pixel area and a second cavity that overlaps the non-pixel area.

The display device may have a support insulation layer disposed on the encapsulation layer; and a cover insulation layer disposed on the support insulation layer, wherein the support insulation layer defines the first cavity by being spaced upward from a portion of the encapsulation layer that overlaps the pixel area and the second cavity by being spaced upward from a portion of the encapsulation layer that overlaps a predetermined portion of the non-pixel area.

The display device may have wherein the support insulation layer contacts a top surface of the encapsulation layer in an area not overlapping the first and second cavities.

The display device may have wherein a first hole is defined in a portion of the support insulation layer that overlaps the first cavity, a second hole is defined in a portion of the support insulation layer that overlaps the second cavity, and the cover insulation layer closes the first and second holes.

The display device may have wherein the support insulation layer has a refractive index greater than that of the cover insulation layer.

The display device may have wherein the support insulation layer comprises an inorganic material, and the cover insulation layer comprises an organic material.

The display device may have wherein the cover insulation layer disposed between the first cavity and the second cavity surrounds the pixel area.

The display device may have wherein the cover insulation layer, disposed between the first cavity and the second cavity comprises a plurality of dot patterns surrounding the pixel area.

The display device may have wherein the cover insulation layer, disposed between the first cavity and the second cavity, is disposed adjacent to both opposite sides of the pixel area and extends in one direction.

The display device may have wherein the first cavity comprises: a first sub-cavity defined by the support insulation layer that is spaced upward from the encapsulation layer that overlaps a first portion of the pixel area; and a second sub-cavity defined by the support insulation layer that is spaced upward from the encapsulation layer that overlaps a second portion of the pixel area, which is spaced apart from the first portion.

The display device may have wherein each of the first and second cavities has a trapezoidal shape.

The display device may have wherein each of the first and second cavities has a trapezoidal shape.

The display device may have wherein the first cavity has a width greater than that of the second cavity.

The display device may further comprise a light emitting element disposed on the pixel area to generate first light; and a transistor disposed on the non-pixel area and connected to the light emitting element.

The display device may have wherein each of the pixel area and the light converter is provided in a plurality, and the plurality of light converters comprise: a first light converter configured to convert the first light into second light; a second light converter configured to convert the first light into third light; and a light transmitting layer configured to transmit the first light therethrough.

The display device may further comprise: a partition insulation layer disposed between the light converters; a plurality of color filters disposed on the light converters, respectively; and a black matrix disposed between the color filters.

In an embodiments of the inventive concept, a method for manufacturing a display device includes: providing an encapsulation layer on a substrate on which a pixel area and a non-pixel area around the pixel area are defined; providing a first photo-resist pattern on the encapsulation layer that overlaps the pixel area, and a second photo-resist pattern on the encapsulation layer that overlaps the non-pixel area; providing a support insulation layer on the encapsulation layer and the first and second photo-resist patterns; defining a first hole by removing a predetermined portion of the support insulation layer on the first photo-resist pattern and a second hole by removing a predetermined portion of the support insulation layer on the second photo-resist pattern; removing the first and second photo-resist patterns by injecting an etching solution to the first and second photo-resist patterns through the first and second holes; closing the first and second holes by providing a cover insulation layer on the support insulation layer; and providing a light converter on the cover insulation layer that overlaps the pixel area.

The method may have wherein the support insulation layer defines the first cavity by being spaced upward from the portion of the encapsulation layer that overlaps the pixel area, defines the second cavity by being spaced upward from the portion of the encapsulation layer that overlaps the non-pixel area, and contacts a top surface of the encapsulation layer in an area not overlapping the first and second cavities.

The method may have wherein each of the first and second cavities has a trapezoidal shape, and the first cavity has a width greater than that of the second cavity.

The method may have wherein the support insulation layer has a refractive index greater than that of the cover insulation layer, and the cover insulation layer disposed between the first cavity and the second cavity surrounds the pixel area.

In an embodiments of the inventive concept, a method for manufacturing a display device includes: preparing an upper substrate on which light converters and an insulation layer disposed on a partition insulation layer between the light converters are provided; providing a cover insulation layer on the insulation layer; defining a first groove in a first portion of the cover insulation layer, which overlaps each of the light converters, and a second groove in a second portion of the cover insulation layer, which overlaps a predetermined portion of the partition insulation layer; providing a support insulation layer on the cover insulation layer; defining a first hole by removing a predetermined portion of the support insulation layer, which overlaps the first groove, and a second groove by removing a predetermine portion of the support insulation layer, which overlaps the second groove; preparing a lower substrate, on which pixels are provide, to face the upper substrate; and providing a light guide layer including the support insulation layer and the cover insulation layer on the pixels.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
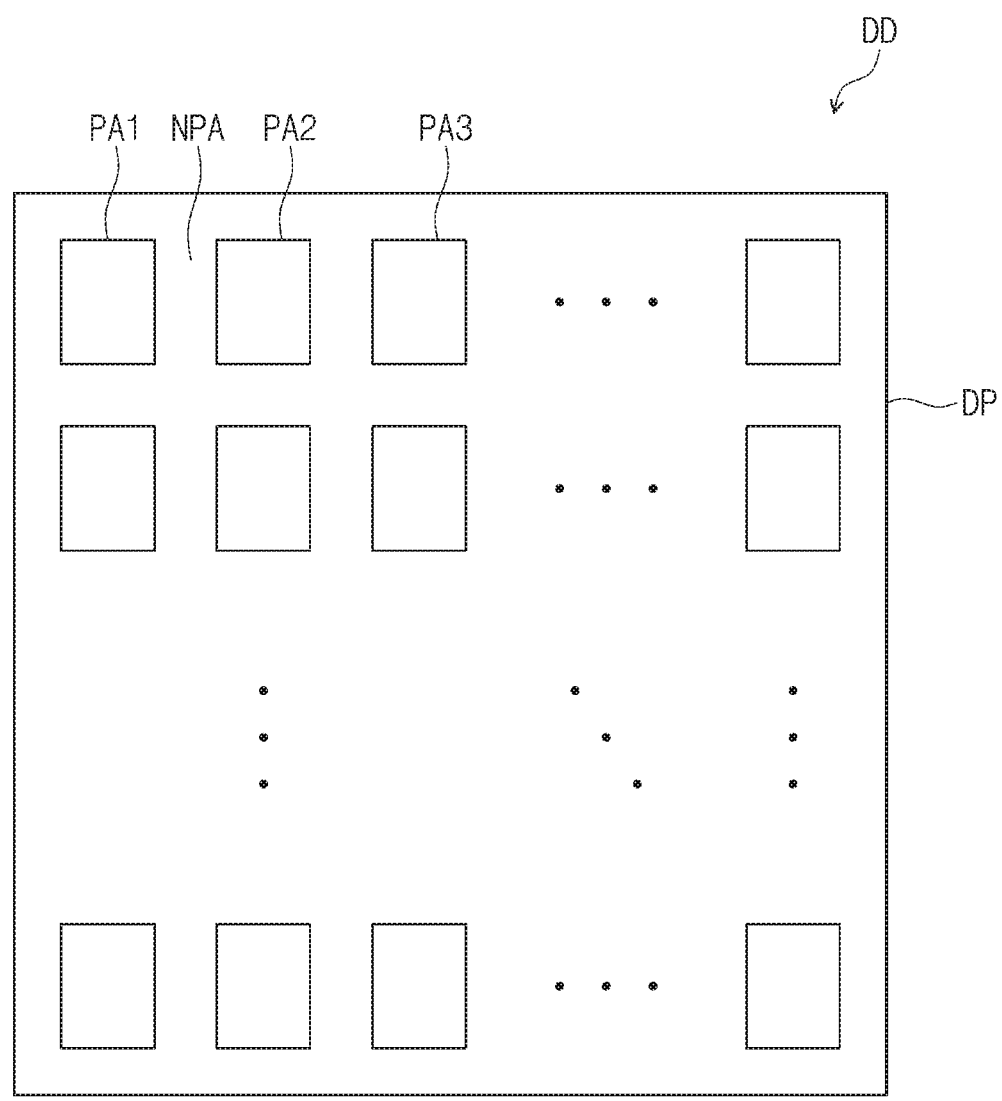
FIG. 1 is a plan view illustrating a display device according to an embodiment of the inventive concept.
Figure 1:
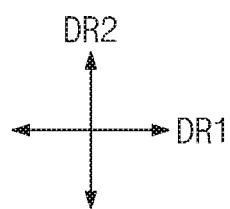

Advantages and features of the inventive concept, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the present disclosure is only defined by scopes of claims. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper" and the like, may be used herein for ease of description to describe one element or feature's relationship to another element(s) or feature(s) as illustrated in the figures. The spatially relative terms should be understood as terms which include different directions of configurative elements in addition to directions illustrated in the figures when using or operating the inventive concept. Like reference numerals refer to like elements throughout.

It will be understood that although the terms of first and second are used herein to describe various elements and/or sections, these elements and/or sections should not be limited by these terms. These terms are only used to distinguish one element, component, or section from another element, component, or section. Accordingly, a first element, a first component, or a first section that will be described below may be a second element, a second component, or a second section within the technical idea of the present disclosure.

The embodiment in the detailed description will be described with schematic cross-sectional views and/or plan views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the inventive concept.

Hereinafter, exemplary embodiments of the inventive concept will be described below in more detail with reference to the accompanying drawings.

Figure 2:
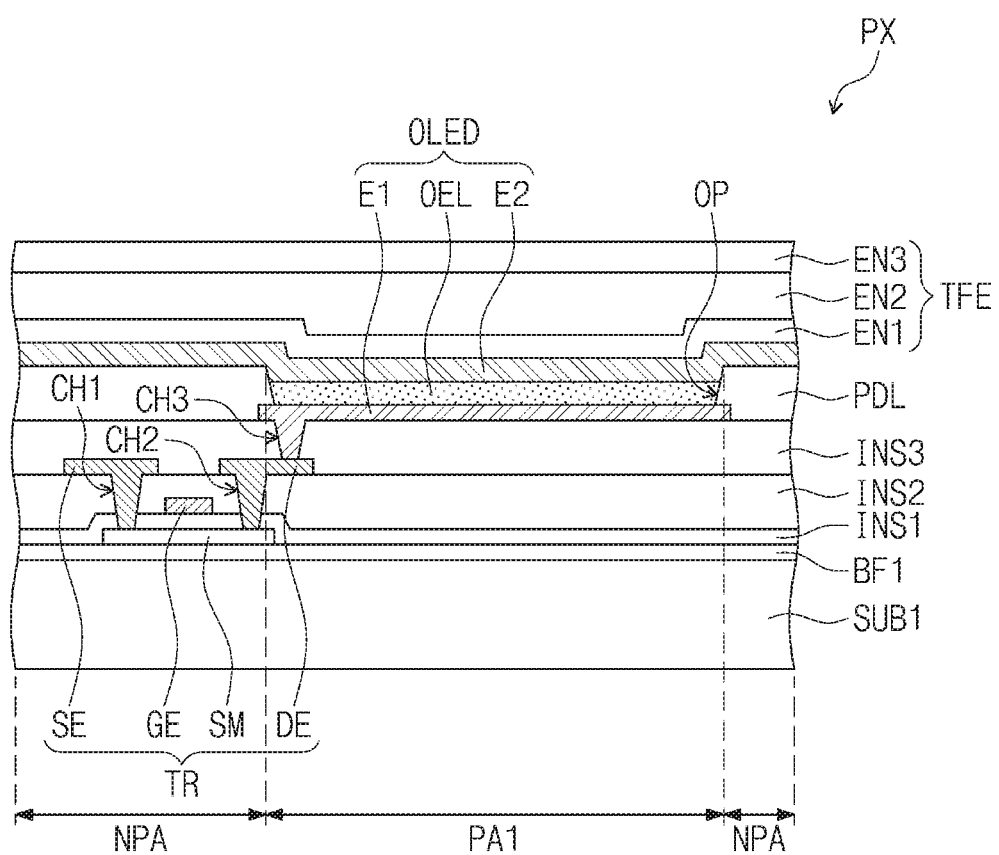
FIG. 2 is a cross-sectional view illustrating one pixel disposed on a display panel in FIG. 1.

FIG. 1 is a plan view illustrating a display device according to an embodiment of the inventive concept. FIG. 2 is a cross-sectional view illustrating one pixel disposed on a display panel in FIG. 1.

Referring to FIG. 1, a display device DD may include a display panel DP. The display panel DP may have a rectangular shape having short sides in a first direction DR1 and long sides in a second direction DR2 crossing the first direction DR1. The display panel DP may have a planar area including a plurality of pixel areas PA1, PA2, and PA3 and a non-pixel area NPA disposed around each of the pixel areas PA1, PA2, and PA3.

Although the pixel areas PA1, PA2, and PA3 are arranged in a matrix form, the embodiment of the inventive concept is not limited thereto. For example, the pixel areas PA1, PA2, and PA3 may be arranged in various forms. Each of the pixel areas PA1, PA2, and PA3 may have a rectangular shape having short sides in the first direction DR1 and long sides in the second direction DR2 However, the embodiment of the inventive concept is not limited thereto. For example, each of the pixel areas PA1, PA2, and PA3 may have various other shapes.

The pixel areas PA1, PA2, and PA3 may include a plurality of first pixel areas PA1, a plurality of second pixel areas PA2, and a plurality of third pixel areas PA3. The first, second, and third pixel areas PA1, PA2, and PA3 may be sequentially arranged in the first direction DR1.

The display panel DP may include a plurality of pixels, and each of the pixels may have a arrangement like a pixel PX in FIG. 2. The arrangement of the pixel PX including the first pixel area PA1 is exemplarily illustrated in FIG. 2.

The pixel PX may be divided into the pixel area PA1 and the non-pixel area NPA. The pixel area PA1 and the non-pixel area NPA around the pixel area PA1 may be defined on a substrate SUB1.

A light emitting element OLED and a transistor TR may be disposed on the first substrate SUB1. The pixel PX may include the light emitting element OLED disposed on the pixel area PA1 and the transistor TR disposed on the non-pixel area NPA. The light emitting element OLED may be connected to the transistor TR.

The first substrate SUB1 may be a transparent substrate containing glass or plastic. When the first substrate SUB1 is made of plastic, the display panel DP may have flexibility.

A buffer layer BF1 may be disposed on the substrate SUB, and the buffer layer BF1 may contain an inorganic material. A semiconductor layer SM of the transistor TR may be disposed on the buffer layer BF1. The semiconductor layer SM may include an organic semiconductor or an inorganic semiconductor made of an inorganic material such as amorphous silicon or poly-silicon. Also, the semiconductor layer SM may include an oxide semiconductor. Although not shown in FIG. 2, the semiconductor layer SM may include a source region, a drain region, and a channel region disposed between the source region and the drain region.

A first insulation layer INS1 may be disposed on the buffer layer BF1 to cover the semiconductor layer SM. The first insulation layer INS1 may contain an inorganic material. A gate electrode GE of the transistor TR, which overlaps the semiconductor layer SM, may be disposed on the first insulation layer INS1. The gate electrode GE may overlap the channel region of the semiconductor layer SM.

A second insulation film INS2 may be disposed on the first insulation film INS1 to cover the gate electrode GE. The second insulation layer INS2 may be defined as an interlayer insulation layer. The second insulation layer INS2 may contain an organic material and/or an inorganic material.

A source electrode SE and a drain electrode DE of the transistor TR may be spaced apart from each other on the second insulation layer INS2. The source electrode SE may be connected to the source region of the semiconductor layer SM through a first contact hole CH1 defined by passing through the first insulation film INS1 and the second insulation film INS2. The drain electrode DE may be connected to the drain region of the semiconductor layer SM through a second contact hole CH2 defined by passing through the first insulation film INS1 and the second insulation film INS2.

A third insulation layer INS3 may be disposed on the second insulation layer INS2 to cover the source electrode SE and the drain electrode DE of the transistor TR. The third insulation layer INS3 may be defined as a flattening layer providing a flat top surface and contain an organic material.

A first electrode E1 of the light emitting element OLED may be disposed on the third insulation layer INS3. The first electrode E1 may be connected to the drain electrode DE of the transistor TR through a third contact hole CH3 defined by passing through the third insulation layer INS3. The first electrode E1 may be a pixel electrode or an anode electrode.

A pixel defining layer PDL exposing a predetermined portion of the first electrode E1 may be disposed on the first electrode E1 and the third insulation layer INS3. An opening OP for exposing a predetermined portion of the first electrode E1 may be defined in the pixel defining layer PDL. The opening OP may overlap the first pixel area PA1.

An organic light emitting layer OEL may be disposed on the first electrode E1 within the opening OP. The organic light emitting layer OEL may contain a low molecular weight organic material or a high molecular weight organic material. In an embodiment of the inventive concept, the organic light emitting layer OEL may generate first light having a blue color.

A second electrode E2 may be disposed on the pixel defining layer PDL and the organic light emitting layer OEL. The second electrode EL2 may be defined as a common electrode or a cathode electrode. The display panel DP may be a front light emitting type organic light emitting display panel. In this case, the first electrode E1 may be a reflective electrode, and the second electrode E2 may be a transparent electrode.

The light emitting element OLED may include the first electrode E1, the organic light emitting layer OEL, and the second electrode E2 in the first pixel area PA1. The first electrode E1 may be a positive electrode that is a hole injection electrode, and the second electrode E2 may be a negative electrode that is an electron injection electrode.

The encapsulation layer TFE may be disposed on the first substrate SUB1 to cover the light emitting element OLED of the pixel PX. For example, the encapsulation layer TFE may be disposed on the second electrode E2. The encapsulation layer TFE may be defined as a thin-film encapsulation layer TFE. The encapsulation layer TFE may include a first encapsulation layer EN1 disposed on the light emitting element OLED, a second encapsulation layer EN2 disposed on the first encapsulation layer EN1, and a third encapsulation layer EN1 disposed on the second encapsulation layer EN2.

Each of the first and third encapsulation layers EN1 and EN3 may contain an inorganic material, and the second encapsulation layer EN2 may contain an organic material. The second encapsulation layer EN2 may have a thickness greater than that of each of the first and third encapsulation layers EN1 and EN3.

A first voltage for allowing the organic light emitting layer OEL of the light emitting element OLED to emit light by the transistor TR may be applied to the first electrode E1, and a second voltage having a polarity opposite to the first voltage may be applied to the second electrode E2. In this case, a hole and an electron, which are injected into the organic light emitting layer OEL, may be coupled to each other to form an exciton, and, while the exciton is transferred to the ground state, the light emitting element OLED may emit light.

Although not shown in FIG. 2, a light guide layer and a light converter may be disposed on the pixel PX, and such a arrangement will be described below in detail with reference to FIG. 3.

Figure 3:
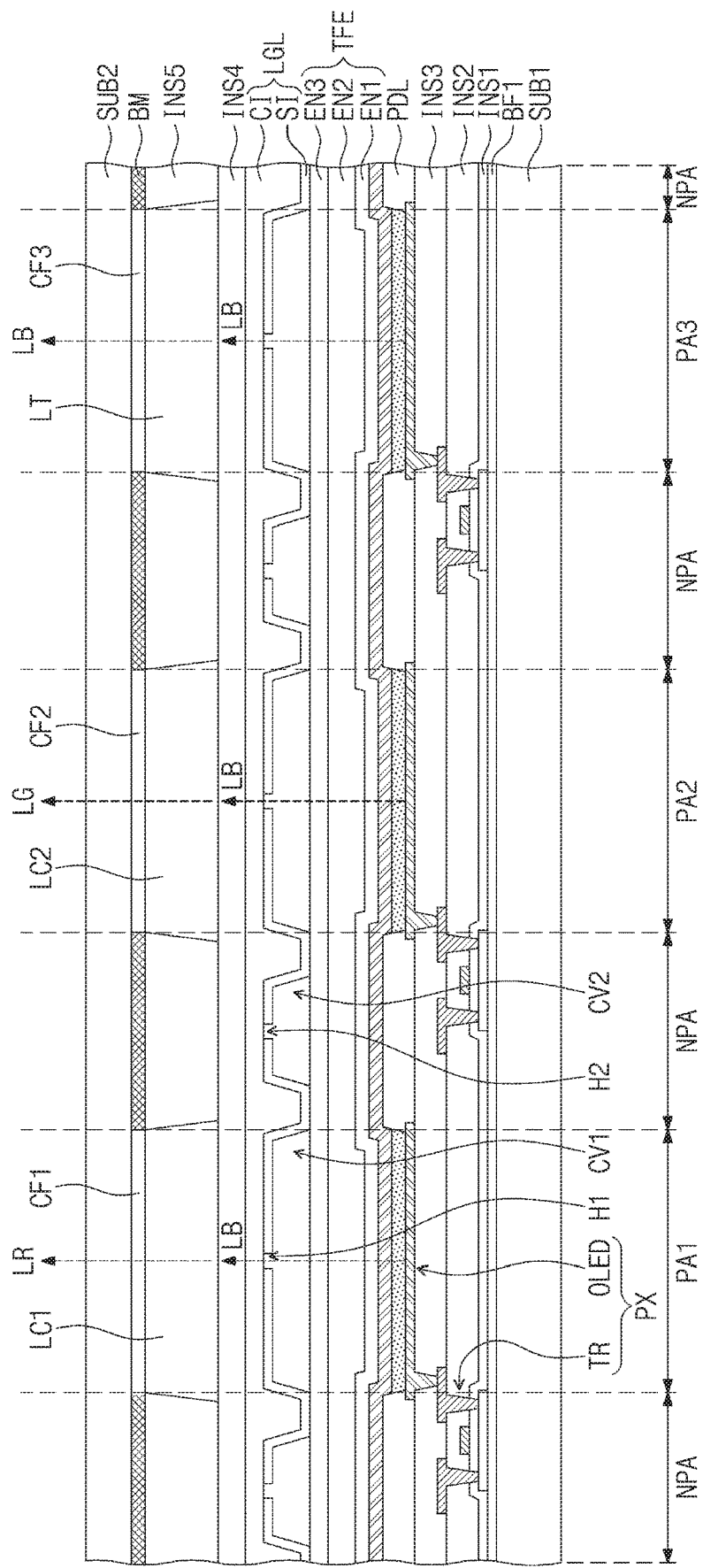
FIG. 3 is a cross-sectional view illustrating a predetermined portion of the display panel for explaining a light guide layer and a light converter disposed on pixels.

FIG. 3 is a cross-sectional view illustrating a predetermined portion of the display panel for explaining the light guide layer and the light converter disposed on the pixels.

For convenience of description, a cross-section of the display panel DP, in which the first pixel area PA1, the second pixel area PA2, and the third pixel area PA3 are disposed, is illustrated in FIG. 3.

Referring to FIG. 3, the display panel DP may include a plurality of light converters LC1, LC2, and LT disposed on the encapsulation layer TFE, a light guide layer LGL disposed between the encapsulation layer TFE and the light converters LC1, LC2, and LT, a plurality of color filters CF1, CF2, and CF3 disposed on the light converters LC1, LC2, and LT, and a black matrix BM disposed between the color filters CF1, CF2, and CF3.

The light guide layer LGL may define a first cavity CV1 overlapping each of the pixel areas PA1, PA2, and PA3 and a second cavity CV2 overlapping a predetermined portion of the non pixel area NPA. The light guide layer LGL may include a support insulation layer SI disposed on the encapsulation layer TFE and a cover insulation layer CI disposed on the support insulation layer SI.

The support insulation layer SI may define a first cavity CV1 overlapping each of the pixel areas PA1, PA2, and PA3 and a second cavity CV2 overlapping a predetermined portion of the non-pixel area NPA. Since the first cavities CV1 overlapping the pixel areas PA1, PA2, and PA3 are the same as each other, hereinafter, the first cavity CV1 will be described with an example of the first pixel area PA1.

The support insulation layer SI may be spaced upward from a portion of the encapsulation layer TFE overlapping the first pixel area PA1 to define the first cavity CV1. The support insulation layer SI may be spaced upward from a portion of the encapsulation layer TFE overlapping a predetermined portion of the non pixel area NPA to define the second cavity CV2. The support insulation layer SI may contact a top surface of the encapsulation layer TFE in an areas not overlapping the first and second cavities CV1 and CV2.

Accordingly, each of the first and second cavities CV1 and CV2 may be defined between the encapsulation layer TFE and the support insulation layer SI in an area overlapping the first pixel area PA1 and an area overlapping a predetermined portion of the non pixel area NPA. Each of the first and second cavities CV1 and CV2 may have a trapezoidal shape. The first cavity CV1 may have a width greater than that of the second cavity CV2.

A first hole H1 may be defined in a predetermined portion of the support insulation layer SI, which overlaps the first cavity CV1. In particular, although the first hole H1 may be defined in a central portion of the support insulation layer SI, which overlaps the first cavity CV1, the embodiment of the inventive concept does not so limit the position of the first hole H1.

A second hole H2 may be defined in a predetermined portion of the support insulation layer SI, which overlaps the second cavity CV2. In particular, although the second hole H2 may be defined in a central portion of the support insulation layer SI, which overlaps the second cavity CV2, the embodiment of the inventive concept does not so limit to the position of the second hole H2.

The cover insulation layer CI covers the support insulation layer SI. The cover insulation layer CI may cover the first and second holes H1 and H2 defined in the support insulation layer SI. Accordingly, the first and second cavities CV1 and CV2 may be closed by the cover insulation layer CI.

The support insulation layer SI may contain an inorganic material, and the cover insulation layer CI may contain an organic material. The support insulation layer SI may have a refractive index greater than that of the cover insulation layer CI. For example, the support insulation layer SI may have a refractive index of about 1.8, and the cover insulation layer CI may have a refractive index of about 1.5. Each of the first and second cavities CV1 and CV2 may have a refractive index of about 1.0, which is the refractive index of air.

A fourth insulation layer INS4 may be disposed on the light guide layer LGL. The fourth insulation layer INS4 may contain an inorganic material.

Light converters LC1, LC2, and LT may be disposed on the fourth insulation layer INS4. The light converters LC1, LC2, and LT may be disposed in a single layer, and the layer in which the light converters LC1, LC2, and LT are disposed may be defined as a light conversion layer. That is, the light conversion layer may include the light converters LC1, LC2, and LT that are disposed in the single layer.

The light converters LC1, LC2, and LT may overlap the pixel areas PA1, PA2, and PA3, respectively. A fifth insulation layer INS5 may be disposed on the fourth insulation layer INS4, and the fifth insulation layer INS5 may be disposed between the light converters LC1, LC2, and LT so as to overlap the non-pixel area NPA.

The light converters LC1, LC2, and LT may include a first light converter LC1 overlapping the first pixel area PA1, a second light converter LC2 overlapping the second pixel area PA2, and a light transmitting layer LT overlapping the third pixel area PA3. The first light converter LC1 may include first quantum dots (not shown), and the second light converter LC2 may include second quantum dots (not shown). The light transmitting layer LT may include light scattering particles (not shown).

The first quantum dots may convert light in a blue wavelength band into light in a red wavelength band. The second quantum dots may convert light in a blue wavelength band into light in a green wavelength band. The light transmitting layer LT may scatter light with the light scattering particles without performing a light converting operation.

The color filters CF1, CF2, and CF3 may be respectively disposed on the light converters LC1, LC2, and LT. The black matrix BM may be disposed on the fifth insulation layer INS5. The color filters CF1, CF2, and CF3 may include a first color filter CF1 disposed on the first light converter LC1, a second color filter CF2 disposed on the second light converter LC2, and a third color filter CF3 disposed on the light transmitting layer LT.

The first color filter CF1 may include a red color filter, the second color filter CF2 may include a green color filter, and the third color filter CF3 may include a transparent color filter. The light transmitting layer LT and the third color filter CF3 may be integrated with each other.

The color filters CF1, CF2, and CF3 and the black matrix BM may be disposed below the second substrate SUB2. The second substrate SUB2 may be a transparent substrate containing glass or plastic.

Each of the light emitting elements OLED of the first, second, and third pixel areas PA1, PA2, and PA3 may generate first light LB having a blue color. The first light LB generated from the light emitting element OLED of the first pixel area PA1 may be provided to the first light converter LC1. The first light LB generated from the light emitting element OLED of the second pixel area PA2 may be provided to the second light converter LC2. The first light LB generated from the light emitting element OLED of the third pixel area PA3 may be provided to the light transmitting layer LT.

The first quantum dots of the first light converter LC1 may convert the first light LB into second light LR. For example, the first quantum dots may convert a blue color wavelength of the first light LB into a red color wavelength to generate the second light LR having the red color wavelength. The second color LR may be emitted upward through the first color filter CF1.

A portion of the first light LB may transmit through the first light converter LC1 without contacting the first quantum dots and be provided to the first color filter CF1. That is, the first light LB that is not converted into the second light LR without contacting the first quantum dots may exist. The first light LB that is not converted in the first light converter LC1 may be converted into the second light LR having a red color in the first color filter CF1 and then emitted upward.

The second quantum dots of the second light converter LC2 may convert the first light LB into third light LG. For example, the second quantum dots of the second light converter LC2 may convert the blue color wavelength of the first light LB into a green color wavelength to generate the third light LG having the green color wavelength. The third light LG may be emitted upward through the second color filter CF2.

A portion of the first light LB may transmit through the second light converter LC2 without contacting the second quantum dots and be provided to the second color filter CF2. That is, the first light LB that is not converted into the third light LG without contacting the second quantum dots may exist. The first light LB that is not converted in the second light converter LC2 may be converted into the third light LG having a green color in the second color filter CF2 and then emitted upward.

The first light LB provided to the light transmitting layer LT may transmit through the light transmitting layer LT and the third color filter CF3 and then be emitted upward. Accordingly, the red, green, and blue light may be emitted through the display panel DP to display an image. The black matrix BM may be disposed in the non pixel area NPA to block unnecessary light.

Figure 4:
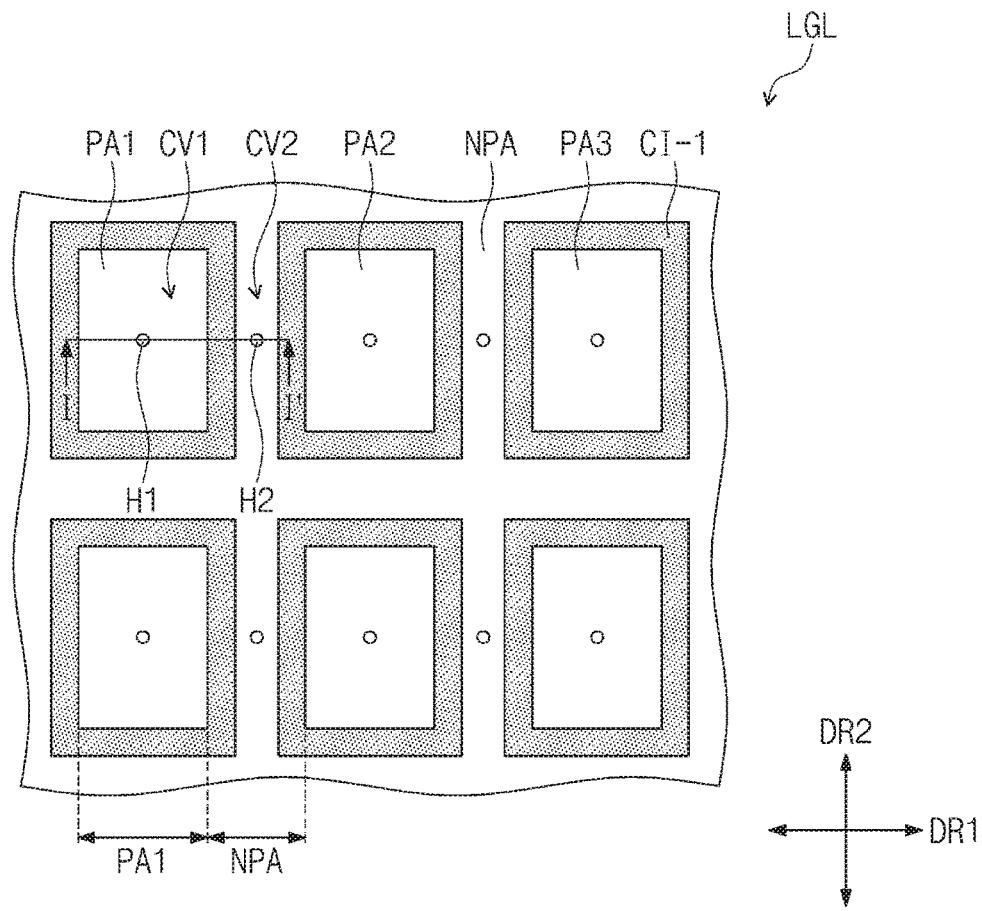
FIG. 4 is a view illustrating a planar arrangement of the light guide layer in FIG. 3.
Figure 5:
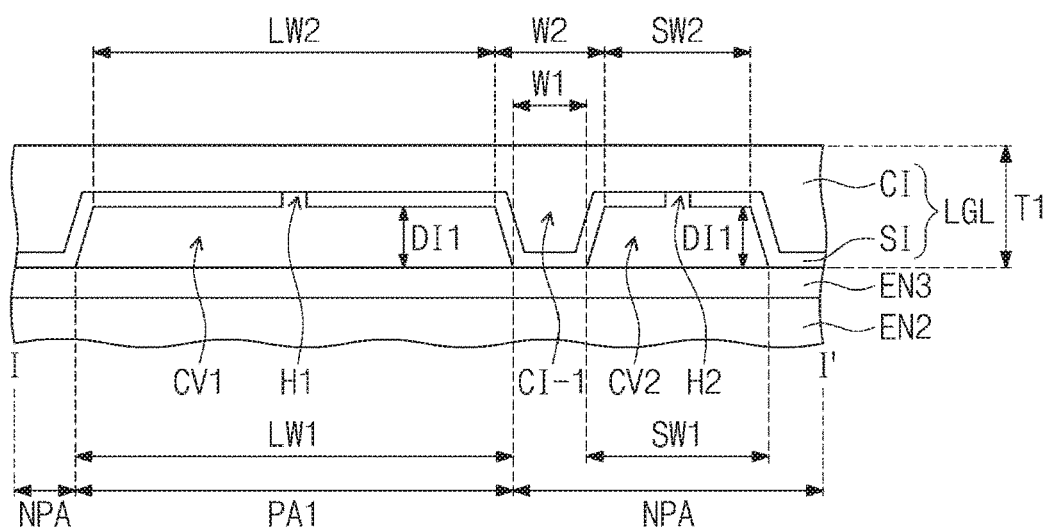
FIG. 5 is a cross-sectional view taken along line I-I' of FIG. 4.

FIG. 4 is a view illustrating a planar arrangement of the light guide layer in FIG. 3. FIG. 5 is a cross-sectional view taken along line I-I' of FIG. 4.

For example, the pixel areas PA1, PA2, and PA3 that are arranged in two rows and three columns are illustrated in FIG. 4. For convenience of description, first cavities CV1, a second cavity CV2, and a cover insulation layer CI-1 between the first cavities CV1 and the second cavity CV2 are illustrated in FIG. 4. Also, the second and third encapsulation layers EN2 and EN3 of the encapsulation layer TFE are illustrated with the light guide layer LGL.

Referring to FIG. 4, the first cavities CV1 overlap the pixel areas PA1, PA2, and PA3, respectively, and the second cavity CV2 overlaps a predetermined portion of the non-pixel area NPA. In terms of a plane, the cover insulation layer CI-1 disposed between each of the first cavities CV1 and the second cavity CV2 may surround each of the pixel areas PA1, PA2, and PA3.

In the first direction DR1, each of the first cavities CV1 may have a width greater than that of the second cavity CV2 overlapping an area between the pixel areas, which are adjacent to each other in the first direction DR1. Also, in the second direction DR2, each of the first cavities CV1 may have a width greater than that of the second cavity CV2 overlapping an area between the pixel areas, which are adjacent to each other in the second direction DR2.

Referring to FIG. 5, a lower end of the first cavity CV1 may have a first long width LW1, and an upper end of the first cavity CV1 may have a second long width LW2 that is less than the first long width LW1. The lower end of the first cavity CV1 may be defined by the encapsulation layer TFE, and the upper end of the first cavity CV1 may be defined by the support insulation layer SI.

A lower end of the second cavity CV2 overlapping an area between the pixel areas, which are adjacent to each other in the first direction DR1, may have a first short width SW1, and an upper end of the second cavity CV2 overlapping an area between the pixel areas, which are adjacent to each other in the first direction DR1, may have a second short width SW2 that is less than the first short width SW1. The lower end of the second cavity CV2 may be defined by the encapsulation layer TFE, and the upper end of the second cavity CV2 may be defined by the support insulation layer SI.

A width between the lower end of the first cavity CV1 and the lower end of the second cavity CV2 may have a first width W1, and a width between the upper end of the first cavity CV1 and the upper end of the second cavity CV2 may have a second width W2. A distance between the lower end and the upper end of each of the first and second cavities CV1 and CV2 may have a first distance DI1. The light guide layer LGL may have a first thickness T1. The first distance DI1 and the first thickness T1 may be set on the basis of a reference direction that is a direction perpendicular to a top surface of the encapsulation layer TFE.

For example, the first long width LW1 may be about 25 μm to about 30 μm, and the second long width LW2 may be about 17 μm to about 22 μm. The first short width SW1 may be about 6 μm to about 7 μm, and the second short width SW2 may be about 4 μm to about 5 μm. The first width W1 may be about 3 μm to about 4 μm, and the second width W2 may be about 4 μm to about 5 μm. The first distance DI1 may be about 3 μm to about 4 μm, and the first thickness T1 may be about 5 μm to about 7 μm.

Each of first and second holes H1 and H2 may have a circular shape. For example, the first and second holes H1 and H2 may have a circular shape when viewed in a plan view. However, the embodiment of the inventive concept is not limited thereto. For example, each of first and second holes H1 and H2 may have a polygonal shape. Each of the first and second holes H1 and H2 may have a diameter that is greater than about 0 μm and less than about 5 μm.

Figure 6:
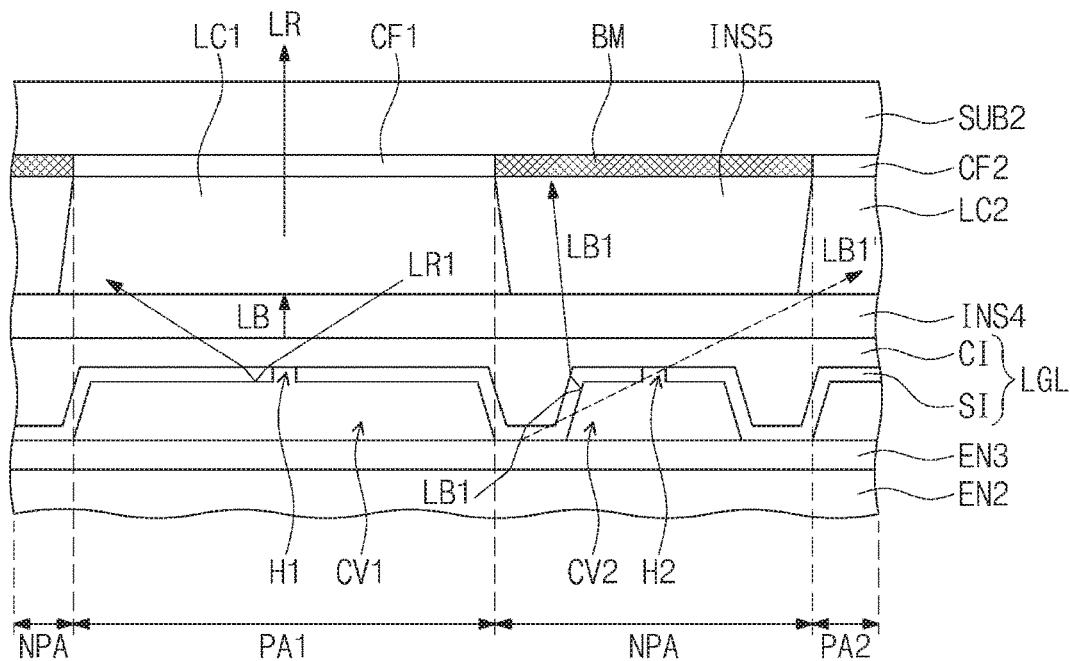
FIG. 6 is view illustrating an example of light refracted in the light guide layer in FIG. 3.

FIG. 6 is view illustrating an example of light refracted in the light guide layer in FIG. 3.

For convenience of description, in FIG. 6, a cross-section of the display panel DP, which corresponds to a portion of the first pixel area PA1 and the second pixel area PA2, is illustrated. Also, the second and third encapsulation layers EN2 and EN3 of the encapsulation layer TFE are illustrated together with the light guide layer LGL.

Referring to FIG. 6, first light LB generated from the first pixel area PA1 may travel to the non-pixel area NPA adjacent to the first pixel area PA1. For example, the third encapsulation layer EN3 may have a refractive index that is greater than that of the second encapsulation layer EN2 and equal to that of the support insulation layer SI. Also, each of the fourth insulation layer INS4 and the fifth insulation layer INS5 may have the same refractive index as the cover insulation layer CI.

When light travels from a first material having a low refractive index to a second material having a high refractive index, the light is refracted at a boundary surface between the first material and the second material so that an output angle is less than an incident angle. When light travels from the second material having a high refractive index to the first material having a low refractive index, the light is refracted at a boundary surface between the first material and the second material so that an output angle is greater than an incident angle. When light travels from the second material having a high refractive index to the first material having a low refractive index, the light may be total-reflected at the boundary surface between the first material and the second material.

The first light LB1 may transmit through the third encapsulation layer EN3 and the support insulation layer SI disposed on the top surface of the third encapsulation layer EN3 and refracted at a boundary surface between the support insulation layer SI and the cover insulation layer CI so that an output angle is greater than an incident angle. The first light LB1 traveled to the cover insulation layer CI may be refracted at a boundary surface between the cover insulation layer CI and the support insulation layer SI adjacent to the first cavity CV1 so that an output angle is less than an incident angle.

The first light LB1 traveled to the support insulation layer SI adjacent to the first cavity CV1 may be total-reflected at a boundary surface between the support insulation layer SI and the first cavity CV1. The total-reflected first light LB1 may be refracted at a boundary surface between the support insulation layer SI and the cover insulation layer CI so that an output angle is greater than an incident angle. The light traveled to the cover insulation layer CI may be traveled upward and provided to the black matrix BM. The first light LB1 may be blocked by the black matrix BM.

Instead of the light guide layer LGL, an air layer may be provided as an empty space at a position at which the light guide layer LGL would be disposed. The air layer may have a refractive index less than that of the encapsulation layer TFE. In this case, the first light LB1 transmitting through the encapsulation layer TFE may be refracted at a boundary surface between the encapsulation layer TFE and the air layer so that an output angle is greater than an incident angle. The refracted first light LB1', which is expressed as a dotted arrow, may be provided to the second light converter LC2.

When the light emitting element OLED of the first pixel area PA1 is driven, and the light emitting element OLED of the second and third pixel areas PA2 and PA3 are not driven, since only red light is generated, the display panel DP may not display a red color. However, when the refracted first light LB1' is provided to the second light converter LC2 like the dotted arrow in FIG. 6, the third light LG having a green color may be emitted. Accordingly, a color mixture phenomenon may be generated between the pixels PX including the first and second pixel areas PA1 and PA2, which are adjacent to each other.

However, in an embodiment of the inventive concept, the first light LB1 may be refracted at the light guide layer LGL so as not to be provided to the second light converter LC2. Instead, the first light LB1 may be provided to and blocked by the black matrix BM. Accordingly, the color mixture phenomenon between the pixels PX may be prevented.

When the first quantum dots of the first light converter LC1 convert the first light LB into the second light LR, the second light LR may be scattered and provided downward. The second light LR1 that is provided downward may transmit through the fourth insulation layer INS4 and the cover insulation layer CI and be refracted at a boundary surface between the cover insulation layer CI and the support insulation layer SI, which are disposed on the first cavity CV1, so that an output angle is less than an incident angle.

The refracted second light LR1 may be total-reflected at a boundary surface between the support insulation layer SI and the first cavity CV1. The total-reflected second light LR1 may be refracted at the boundary surface between the cover insulation layer CI and the support insulation layer SI, which are disposed on the first cavity CV1, so that an output angle is greater than an incident angle, and then provided to the first light converter LC1. Since the second light LR1 that travels downward is reflected at the light guide layer LGL without being lost, and then provided to the first light converter LC1, a light efficiency of the display device DD may increase.

As a result, the display device DD according to an embodiment of the inventive concept may prevent the color mixture phenomenon and increase the light efficiency.

Figure 7:
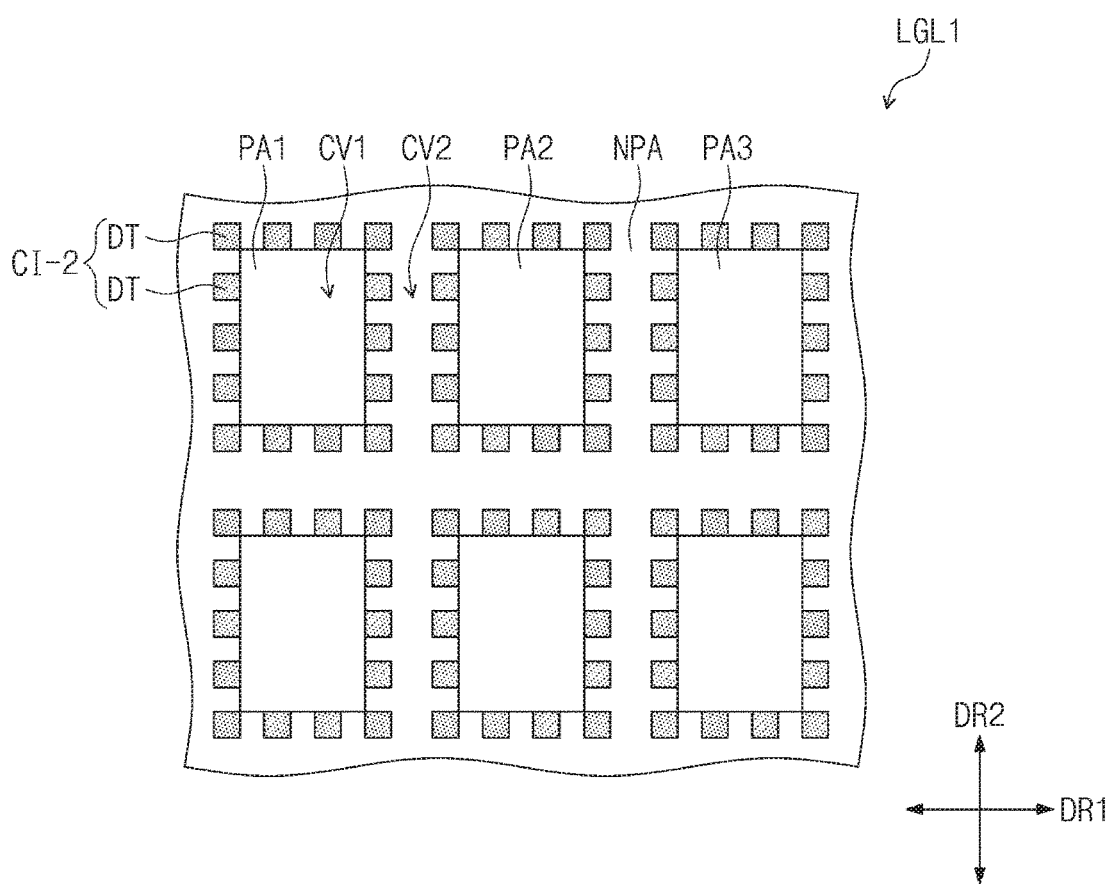
FIGS. 7, 8, and 9 are views illustrating various embodiments of the light guide layer according to an embodiment of the inventive concept.
Figure 8:
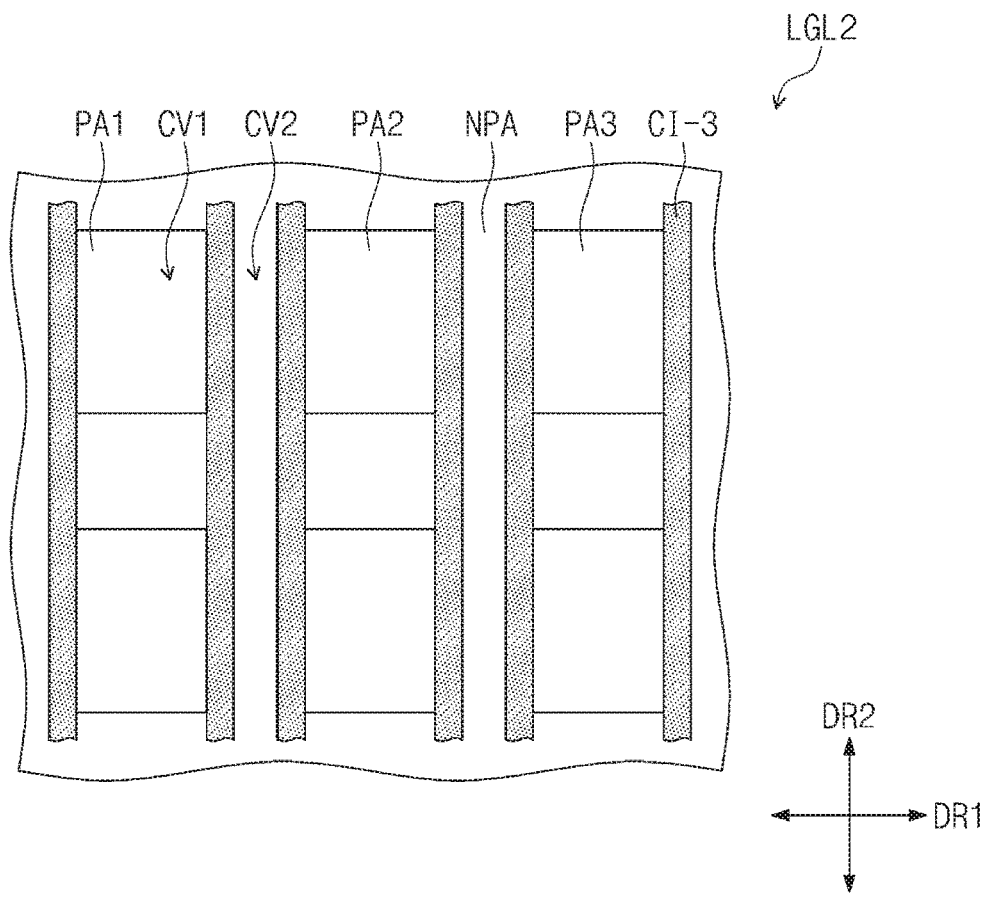
Figure 9:
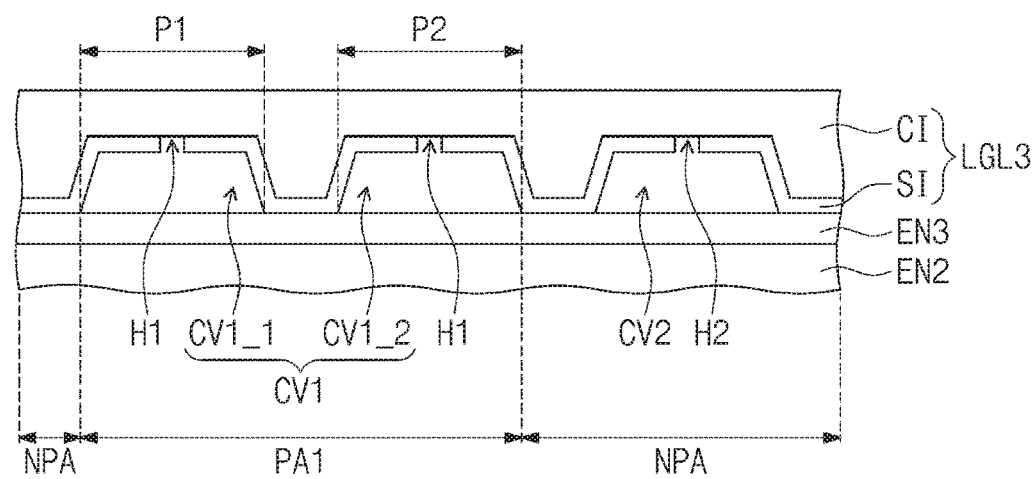

FIGS. 7 to 9 are views illustrating various embodiments of the light guide layer according to an embodiment of the inventive concept.

Hereinafter, features of light guide layers LGL1, LGL2, and LGL3 in FIGS. 7 to 9, which are different from those of the light guide layer LGL in FIGS. 3 to 5, will be mainly described.

Referring to FIG. 7, a cover insulation layer CI-2 disposed between each of the first cavities CV1 and the second cavity CV2 may surround each of pixel areas PA1, PA2, and PA3. The cover insulation layer CI-2 may include a plurality of dot patterns DT. Each of the dot patterns DT may have a rectangular shape and surround each of the pixel areas PA1, PA2, and PA3.

Substantially, the cover insulation layer CI-2 may be formed in the dot patterns DT. A different arrangement of the light guide layer LGL1 may be the same as that of the light guide layer LGL in FIGS. 3 to 5.

Referring to FIG. 8, a cover insulation layer CI-3 disposed between each of the first cavities CV1 and the second cavity CV2 may be adjacent to two facing sides of each of the pixel areas PA1, PA2, and PA3, and extend in one direction. Therefore, each of the first cavities CV1 and the second cavity CV2 may extend in one direction.

For example, the cover insulation layer CI-3 may be disposed adjacent to long sides of each of the pixel areas PA1, PA2, and PA3 and extend in the second direction DR2. However, the embodiment of the inventive concept is not limited thereto. For example, the cover insulation layer CI-3 may be disposed adjacent to short sides of each of the pixel areas PA1, PA2, and PA3 and extend in the first direction DR1. Other features of the light guide layer LGL2 may be the same as those of the light guide layer LGL in FIGS. 3 to 5.

Referring to FIG. 9, the first cavity CV1 may include a first sub-cavity CV1_1 and a second sub-cavity CV1_2, which are spaced apart from each other. The support insulation layer SI may be spaced upward from a portion of the encapsulation layer TFE overlapping a first portion P1 of the first pixel area PA1 to define the first sub-cavity CV1_1.

The support insulation layer SI may be spaced upward from a portion of the encapsulation layer TFE overlapping a second portion P2 of the first pixel area PA1 to define the second sub-cavity CV1_2. The first portion may be spaced apart from the second portion P2.

The first hole H1 may be defined in each of a predetermined portion of the support insulation layer SI, which overlaps the first sub-cavity CV1_1, and a predetermined portion of the support insulation layer SI, which overlaps the second sub-cavity CV1_2. Other features of the light guide layer LGL3 may be the same as those of the light guide layer LGL in FIGS. 3 to 5.

As the first cavity CV1 is separated into the two sub-cavities CV1_1 and CV1_2, the support and cover insulation layers SI and CI between the first sub-cavity CV1_1 and the second sub-cavity CV1_2 may serve as a supporting body like a bridge. Accordingly, a structure for defining the first cavity CV1 may be stronger.

FIGS. 10 to 15 are views for explaining a method for manufacturing the display device according to an embodiment of the inventive concept.

For convenience of description, FIGS. 10 to 15 illustrate a cross-section corresponding to the cross-section in FIG. 5. Hereinafter, a method for forming a first cavity CV1 on a first pixel area PA1 and a method for forming a second cavity CV2 on a non-pixel area NPA around the first pixel area PA1 will be exemplarily described. Although not shown, a method for forming the first and second cavities CV1 and CV2 on other pixel areas PA2 and PA3 and the non-pixel area NPA around the other pixel areas PA2 and PA3 may be the same as that in FIGS. 10 to 15.

Figure 10:
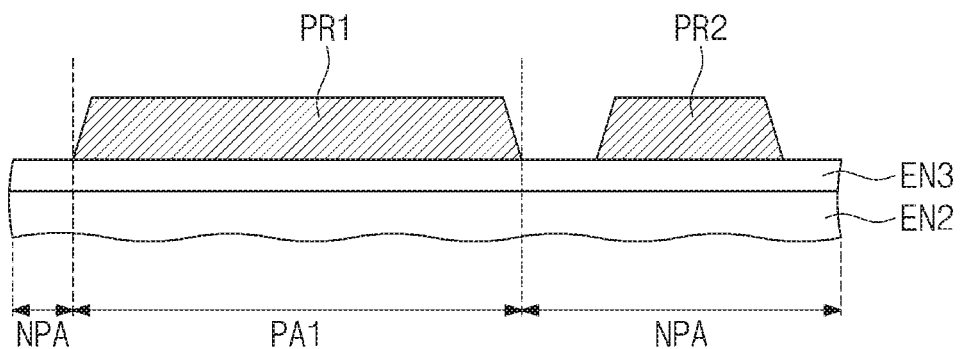
FIGS. 10, 11, 12, 13, 14, and 15 are views for explaining a method for manufacturing the display device according to an embodiment of the inventive concept.

Referring to FIG. 10, an encapsulation layer TFE covering pixels PX may be provided on a first substrate SUB1. First and second photoresist patterns PR1 and PR2 may be provided on the encapsulation layer TFE.

Particularly, a first photoresist pattern PR1 may be provided on a third encapsulation layer EN3 overlapping a first pixel area PAL A second photoresist pattern PR2 may be provided on the third encapsulation layer EN3 overlapping a predetermined portion of the non-pixel area NPA.

The first photoresist pattern PR1 may be a portion for defining the first cavity CV1, and the second photoresist pattern PR2 may be a portion for defining the second cavity CV2. For example, a photosensitive resin (or photoresist) may be disposed on the third encapsulation layer EN3. A first portion of the photosensitive resin does not include the portions for forming the first and second cavities CV1 and CV2. A photomask for exposing the first portion of the photosensitive resin may be disposed on the photosensitive resin.

As the first portion of the photosensitive resin may be exposed by using the photomask, and the first portion of the photosensitive resin is removed by a developer, the first and second photoresist patterns PR1 and PR2 may be formed. The photosensitive resin used to form the first and second photoresist patterns PR1 and PR2 may be a positive-type photoresist.

Although not shown, a pre-curing process may be performed on the first and second photoresist patterns PR1 and PR2. As illustrated in FIG. 10, a side surface of each of the first and second photoresist patterns PR1 and PR2 may flow down during the pre-curing process, and thus the side surface of each of the first and second photoresist patterns PR1 and PR2 may have an inclined surface. For example, during the pre-curing process, a temperature of about 130° C. to about 149° C. may be applied to the first and second photoresist patterns PR1 and PR2.

Figure 11:
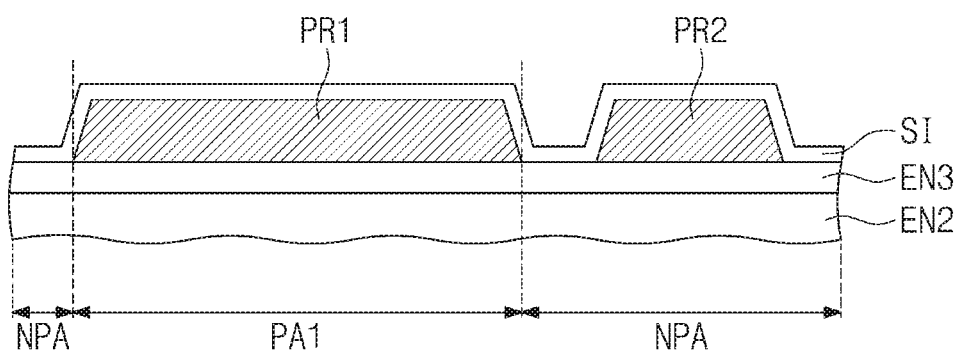

Referring to FIG. 11, a support insulation layer SI may be provided on the third encapsulation layer EN3 and the first and second photoresist patterns PR1 and PR2.

Figure 12:
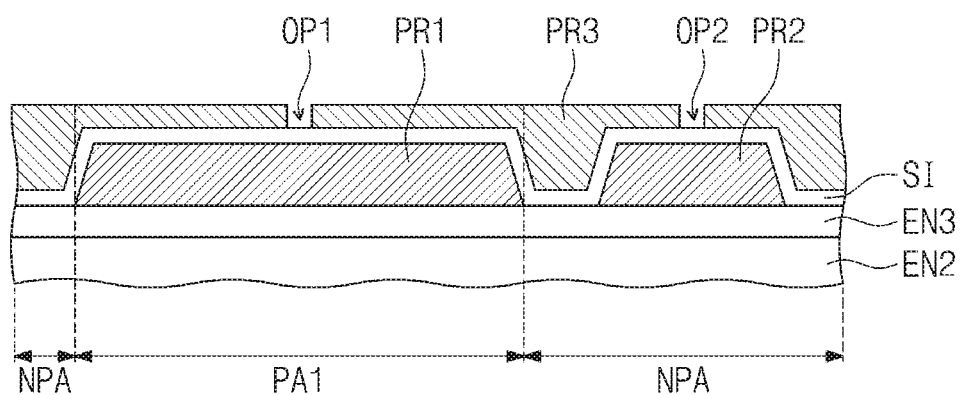

Referring to FIG. 12, a third photoresist PR3 may be provided on the support insulation layer SI. A first opening OP1 may be defined by removing a portion of the third photoresist PR3, which overlaps a predetermined portion of the support insulation layer SI on the first photoresist pattern PR1. The first opening OP1 may substantially overlap the first hole H1.

A second opening OP2 may be defined by removing a portion of the third photoresist PR3, which overlaps a predetermined portion of the support insulation layer SI on the second photoresist pattern PR2. The second opening OP2 may substantially overlap the second hole H2.

Figure 13:
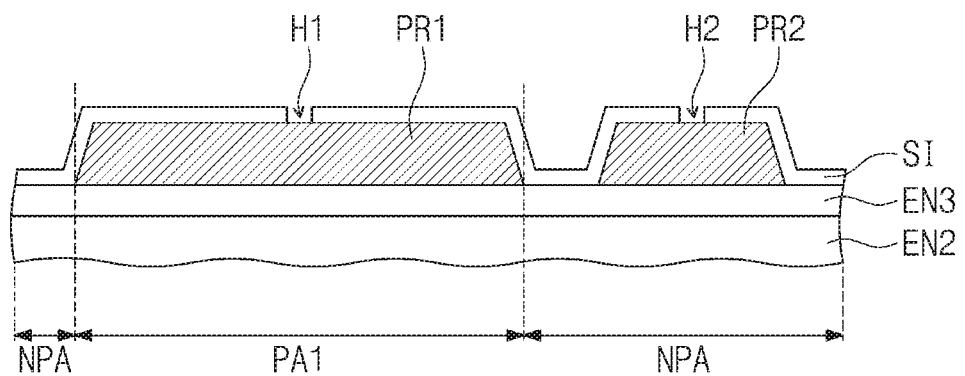

Referring to FIG. 13, the first and second holes H1 and H2 may be defined by removing portions of the support insulation layer SI, which overlap the first and second openings OP1 and OP2 by using the third photoresist PR3 as a mask.

That is, the first hole H1 may be defined by removing a predetermined portion of the support insulation layer SI on the first photoresist pattern PR1, and the second hole H2 may be defined by removing a predetermined portion of the support insulation layer SI on the second photoresist pattern PR2. The first and second holes H1 and H2 may be formed, and then the third photoresist PR3 may be removed.

Figure 14:
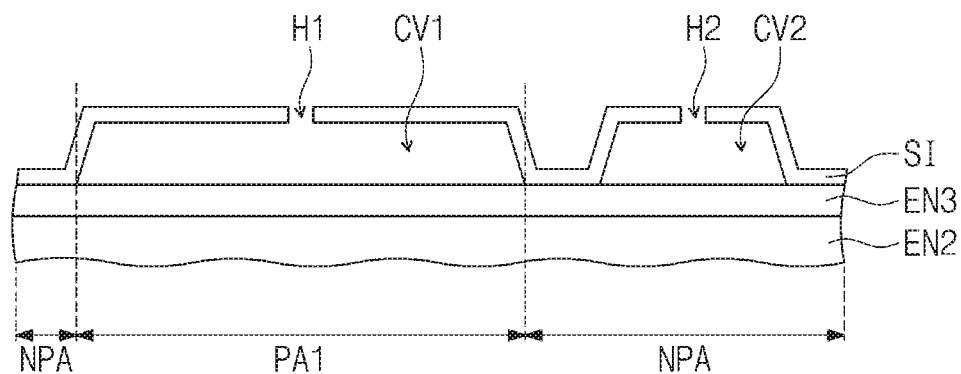

Referring to FIG. 14, the first and second photoresist patterns PR1 and PR2 may be removed by injecting an etching solution to the first and second photoresist patterns PR1 and PR2 through the first and second holes H1 and H2. Accordingly, the first and second cavities CV1 and CV2 may be formed.

Figure 15:
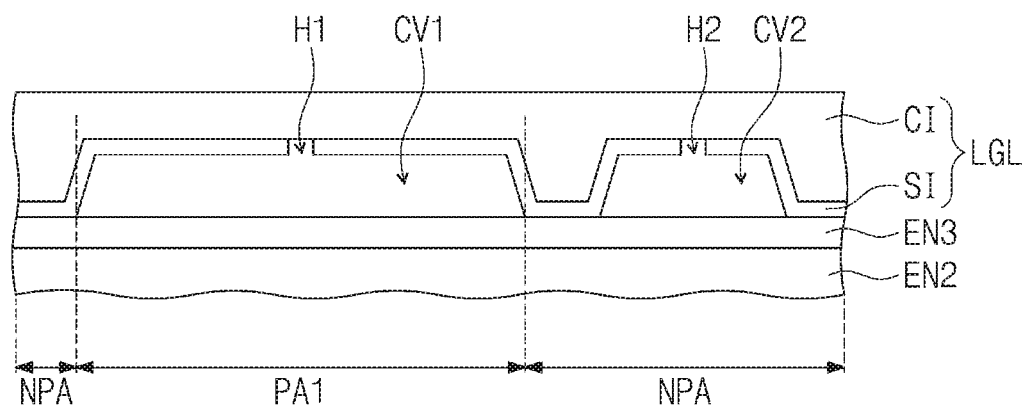

Referring to FIG. 15, a light guide layer LGL may be manufactured by providing a cover insulation layer CI on the support insulation layer SI. The cover insulation layer CI may be disposed to cover the first and second holes H1 and H2 to close the first and second holes H1 and H2.

As an organic material having fluidity is cured, the cover insulation layer CI may be formed. The organic material for forming the cover insulation layer CI may have a viscosity of about 200 centi-poise (cP) or more, and each of the first and second holes H1 and H2 may have a diameter greater than about 0 μm and less than about 5 μm.

When the organic material has a viscosity of about 200 cP or more, and each of the holes H1 and H2 has a diameter greater than about 0 μm and less than about 5 μm, the organic material may not be injected into the first and second cavities CV1 and CV2 through the first and second holes H1 and H2.

As the light converters LC1, LC2, and LT, the color filters CF1, CF2, and CF3, and the black matrix BM in FIG. 3 are disposed on the light guide layer LGL, the display device DD may be manufactured.

FIGS. 16 to 20 are views for explaining a method for manufacturing the display device according to another embodiment of the inventive concept.

In FIGS. 10 to 15, the method for forming the light guide layer LGL on the encapsulation layer TFE disposed on the first substrate SUB1 is illustrated. However, In FIGS. 16 to 20, a method for forming the light guide layer LGL on the light converters LC1, LC2, and LT disposed on the second substrate SUB2 is illustrated.

For convenience of description, although a method for forming a light guide plate LGL on a fourth insulation layer INS4 disposed on a first light converter LC1 and a fifth insulation layer INS5 is illustrated in FIGS. 16 to 19, the second substrate SUB2, the color filter layers CF1, CF2, and CF3, and the black matrix BM are omitted in the depiction. Substantially, the second substrate SUB2, on which the light converters LC1, LC2, and LT are disposed, in FIG. 3 may be turned over, and then the light guide layer LGL may be manufactured on the light converters LC1, LC2, and LT.

Hereinafter, a method for forming a first cavity CV1 on a first light converter LC1 corresponding to a first pixel area PA1 and a method for forming a second cavity CV2 on a fifth insulation layer INS5 corresponding to a non-pixel area NPA around the first pixel area PA1 will be exemplarily described. Although not shown, a method for forming the first and second cavities CV1 and CV2 on the other light converters LC2 and LT and a fifth insulation layer INS5 may be also the same as that illustrated in FIGS. 16 to 20.

Figure 16:
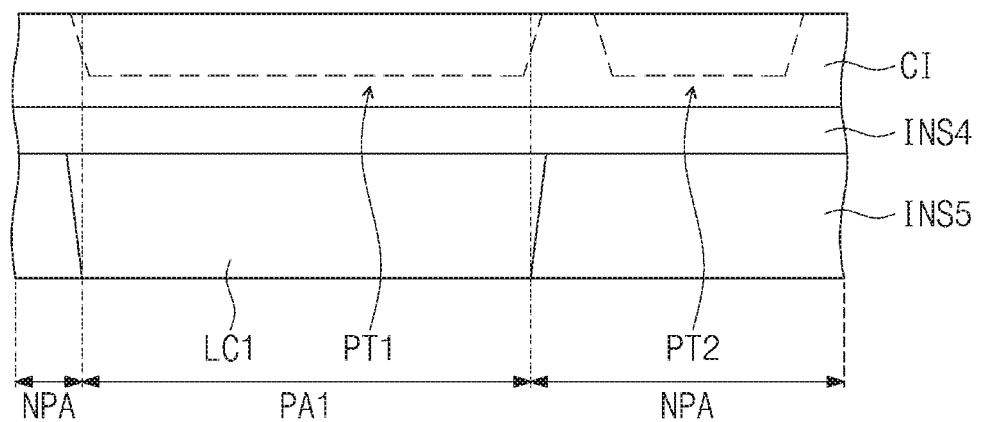
FIGS. 16, 17, 18, 19, and 20 are views for explaining a method for manufacturing a display device according to another embodiment of the inventive concept.

Referring to FIG. 16, a second substrate SUB2 provided with the fourth insulation layer INS4 disposed on the light converters LC1, LC2, and LT and the fifth insulation layer INS5 may be prepared. The second substrate SUB2 may be defined as an upper substrate. Hereinafter, the fifth insulation layer INS5 is defined as a partition insulation layer INS5, and the fourth insulation layer INS4 is defined as an insulation layer INS4.

A cover insulation layer CI may be provided on the insulation layer INS4. A first portion PT1 of the cover insulation layer CI, which overlaps the first light converter LC1, may be partially exposed by a half-tone mask (not shown). Also, a second portion PT2 of the cover insulation layer CI, which overlaps a predetermined portion of the partition insulation layer INS5, may be partially exposed by using the half-tone mask (not shown).

The first light converter LC1 may overlap the first pixel area PA1, and a predetermined portion of the partition insulation layer INS5 may overlap a predetermined portion of the non-pixel area NPA. In light of the present disclosure, one of ordinary skill in the art would understand the workings of a half-tone mask, so detailed description of the half-tone mask will be omitted for convenience of description. In FIG. 16, an exposed portion is expressed as a dotted line of a reversed trapezoid.

Figure 17:
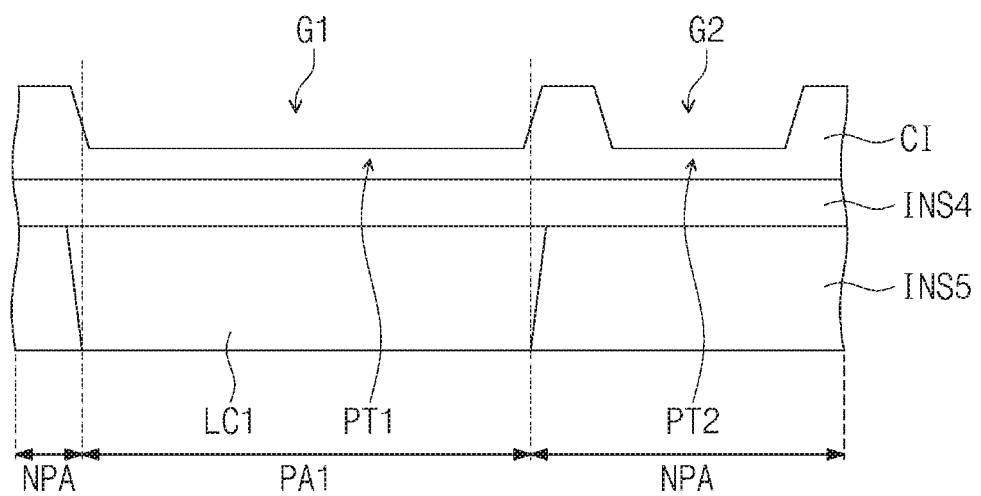

Referring to FIG. 17, as the portion exposed by the half-tone mask is removed, a first groove G1 may be defined in a first portion PT1, and a second groove G2 may be defined in a second portion PT2.

Figure 18:
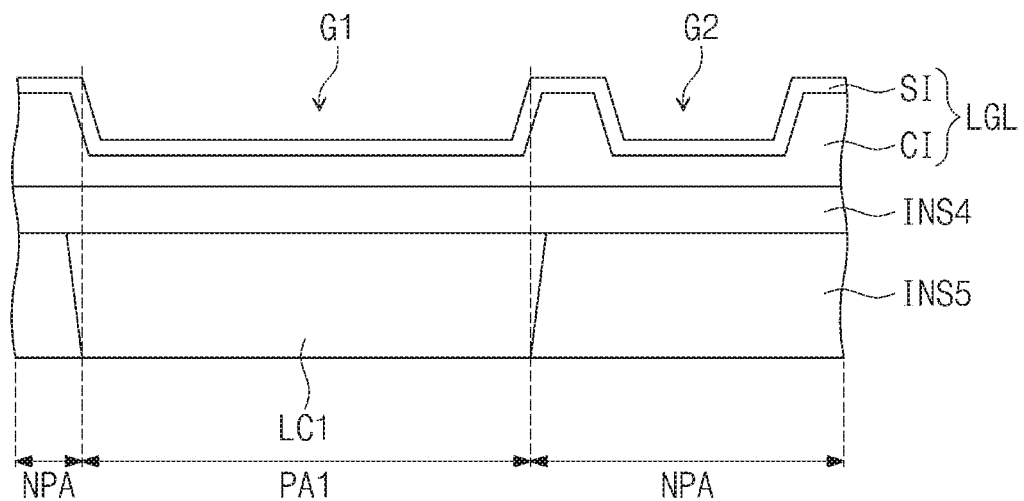
Figure 19:
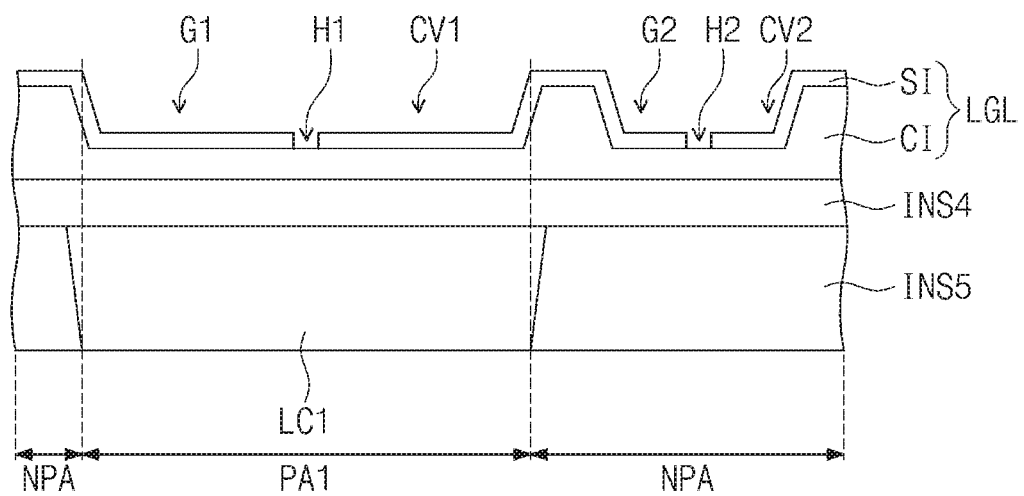
Figure 20:
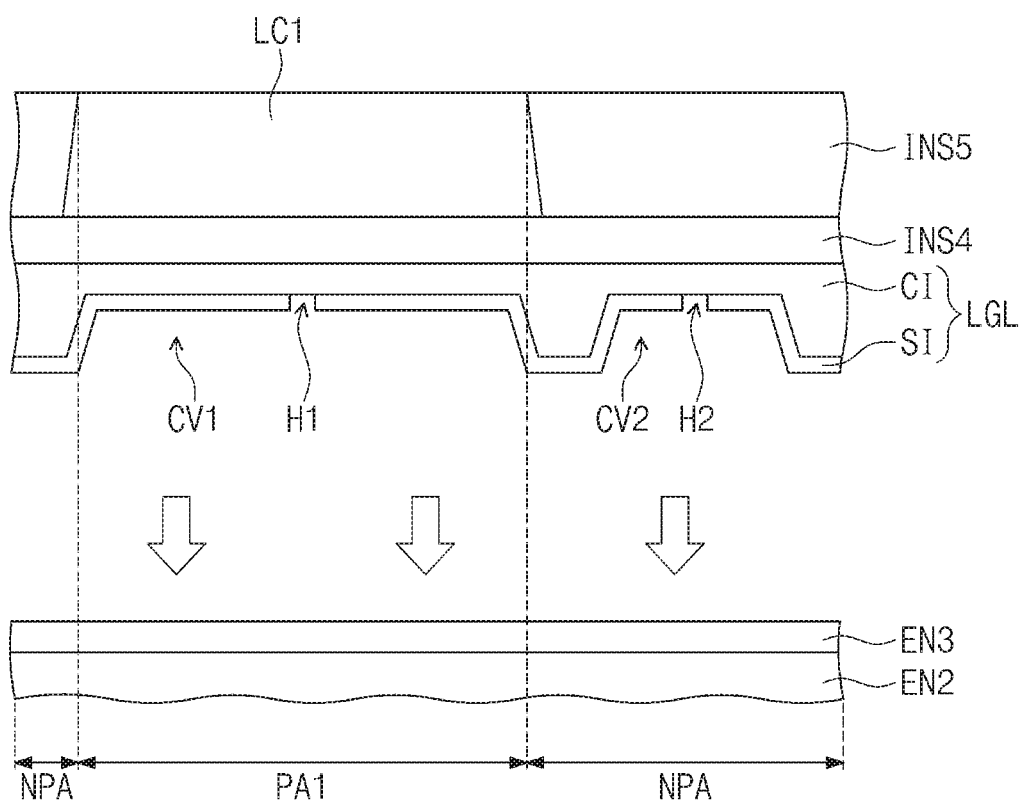

Referring to FIGS. 18 and 19, a support insulation layer SI may be provided on the cover insulation layer CI. A first hole H1 may be defined by removing a predetermined portion of the support insulation layer SI, which overlaps the first groove G1. A second hole H2 may be defined by removing a predetermined portion of the support insulation layer SI, which overlaps the second groove G2. Substantially, the first groove G1 may correspond to the first cavity CV1, and the second groove G2 may correspond to the second cavity CV2.

A first substrate SUB1 provided with pixels PX and an encapsulation layer TFE covering the pixels PX may be prepared. The first substrate SUB1 may be defined as a lower substrate SUB1 facing the upper substrate SUB2. For convenience of description, in FIG. 20, the first substrate SUB1, the upper substrate SUB2, and the pixels PX are omitted, and second and third encapsulation layers EN2 and EN3 of the encapsulation layer TFE are illustrated.

The second substrate SUB2, on which the first light converter LC1 is disposed, may be turned over, and the light guide layer LGL may be disposed to face downward. The light guide layer LGL may be disposed on the encapsulation layer TFE and bonded to the encapsulation layer TFE. Accordingly, as the light guide layer LGL is provided on the pixels PX, the display device DD may be manufactured.

The display device DD that is manufactured by the above-described manufacturing method may prevent color mixture between the pixels PX and improve a light efficiency.

The display device according to the embodiment of the inventive concept may include the light guide layer disposed between the pixels and the light converter, and the light generated from each of the pixels may be guided by the light guide layer to prevent the light from being provided to another light converter that is adjacent to the corresponding light converter. Also, light, which travels rearward, of the light generated from the light converter may be reflected by the light guide layer and then provided to the light converter again. Thus, the embodiment of the inventive concept may provide the display device that prevents the color mixture phenomenon and improves the light efficiency.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display device comprising:
   a substrate on which a pixel area and a non-pixel area around the pixel area are defined;
   an encapsulation layer disposed on the substrate;
   a light conversion layer including a light converter disposed on the encapsulation layer to overlap the pixel area; and
   a light guide layer disposed between the encapsulation layer and the light conversion layer to define a first cavity that overlaps the pixel area and a second cavity that overlaps the non-pixel area.

2. The display device of claim 1, wherein the light guide layer comprises:
   a support insulation layer disposed on the encapsulation layer; and
   a cover insulation layer disposed on the support insulation layer,
   wherein the support insulation layer defines the first cavity by being spaced upward from a portion of the encapsulation layer that overlaps the pixel area and the second cavity by being spaced upward from a portion of the encapsulation layer that overlaps a predetermined portion of the non-pixel area.

3. The display device of claim 2, wherein the support insulation layer contacts a top surface of the encapsulation layer in an area not overlapping the first and second cavities.

4. The display device of claim 2, wherein a first hole is defined in a portion of the support insulation layer that overlaps the first cavity, a second hole is defined in a portion of the support insulation layer that overlaps the second cavity, and the cover insulation layer closes the first and second holes.

5. The display device of claim 2, wherein the support insulation layer has a refractive index greater than that of the cover insulation layer.

6. The display device of claim 2, wherein the support insulation layer comprises an inorganic material, and the cover insulation layer comprises an organic material.

7. The display device of claim 2, wherein the cover insulation layer disposed between the first cavity and the second cavity surrounds the pixel area.

8. The display device of claim 2, wherein the cover insulation layer disposed between the first cavity and the second cavity comprises a plurality of dot patterns surrounding the pixel area.

9. The display device of claim 2, wherein the cover insulation layer disposed between the first cavity and the second cavity is disposed adjacent to both opposite sides of the pixel area and extends in one direction.

10. The display device of claim 2, wherein the first cavity comprises:
a first sub-cavity defined by the support insulation layer that is spaced upward from the encapsulation layer that overlaps a first portion of the pixel area; and
a second sub-cavity defined by the support insulation layer that is spaced upward from the encapsulation layer that overlaps a second portion of the pixel area, which is spaced apart from the first portion.

11. The display device of claim 1, wherein each of the first and second cavities has a trapezoidal shape.

12. The display device of claim 1, wherein the first cavity has a width greater than that of the second cavity.

13. The display device of claim 1, further comprising a light emitting element disposed on the pixel area to generate first light; and
a transistor disposed on the non-pixel area and connected to the light emitting element.

14. The display device of claim 13, wherein each of the pixel area and the light converter is provided in a plurality, and
the plurality of light converters comprise:
a first light converter configured to convert the first light into second light;
a second light converter configured to convert the first light into third light; and
a light transmitting layer configured to transmit the first light therethrough.

15. The display device of claim 14, further comprising:
a partition insulation layer disposed between the light converters;
a plurality of color filters disposed on the light converters, respectively; and
a black matrix disposed between the color filters.

* * * * *